(12) United States Patent
Jia et al.

(10) Patent No.: US 7,571,992 B2
(45) Date of Patent: Aug. 11, 2009

(54) PRESSURE COMPENSATION STRUCTURE FOR MICROELECTROMECHANICAL SYSTEMS

(75) Inventors: Nancy Y. Jia, Webster, NY (US); Peter J. Nystrom, Webster, NY (US); Gerald A. Domoto, Briarcliff Manor, NY (US); Peter M. Gulvin, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 446 days.

(21) Appl. No.: 11/174,120

(22) Filed: Jul. 1, 2005

(65) Prior Publication Data
US 2007/0008377 A1  Jan. 11, 2007

(51) Int. Cl.
*B41J 2/045* (2006.01)
(52) U.S. Cl. .............................. 347/70; 347/68; 347/65
(58) Field of Classification Search ............. 347/63–65, 347/27, 67–72, 94; 29/890.1; 217/27
See application file for complete search history.

(56) References Cited
U.S. PATENT DOCUMENTS

| | | | |
|---|---|---|---|
| 5,912,684 A * | 6/1999 | Fujii et al. | 347/54 |
| 6,357,865 B1 | 3/2002 | Kubby et al. | |
| 6,390,603 B1 | 5/2002 | Silverbrook | |
| 6,413,793 B1 | 7/2002 | Lin et al. | |
| 6,450,625 B1 * | 9/2002 | Fujii et al. | 347/70 |
| 6,467,879 B1 | 10/2002 | Kubby et al. | |
| 6,508,947 B2 | 1/2003 | Gulvin et al. | |
| 6,662,448 B2 | 12/2003 | Kubby et al. | |
| 2005/0104941 A1 * | 5/2005 | Tanaka | 347/70 |

* cited by examiner

*Primary Examiner*—Matthew Luu
*Assistant Examiner*—Henok Legesse
(74) *Attorney, Agent, or Firm*—Maginot, Moore & Beck

(57) ABSTRACT

A fluidic micro-electromechanical device includes a pressure compensating subsystem that enables the device to operate consistently in changing environmental pressure conditions. Such a fluidic micro-electromechanical device includes an actuator having an actuator cavity underneath an actuator membrane, the actuator membrane moving in response to a driving signal applied to an actuator electrode, and a pressure compensating chamber coupled to the actuator cavity.

13 Claims, 6 Drawing Sheets

PRESSURE COMPENSATION STRUCTURE FOR MICROELECTROMECHANICAL SYSTEMS

BACKGROUND AND SUMMARY

The systems described herein relate to micro-electromechanical systems ("MEMS") and, more particularly, to MEMS having structures containing fluids.

Micro-electromechanical systems are mechanical systems that are micromachined in silicon and may be optionally integrated with control electronic circuits. MEMS are generally categorized as either microsensor or microactuator systems, depending on the application. MEMS incorporate electrostatic, electromagnetic, thermoelastic, piezoelectric, or piezoresistive effects in the operations of the systems.

Fluidic MEMS often include a closed chamber, sealed membrane, or other fluid passageway. A MEMS device with a closed chamber, a sealed membrane, or other fluid delivery system may be susceptible to differential pressure. This pressure variation can occur during various stages of a device's lifetime from processing, storage, or shipping of the device for operation at different locations. For example, the pressure variation can arise from operation at various altitudes, trapped pressure, temperature change, out-gassing of materials used in the device or active operation (such as pumping or priming). Differential pressure may cause undesirable membrane deflection, including bulging or collapsing membranes, trapped bubbles or fluids in the cavities behind the membranes or cracking or bursting resulting in a change of device performance and/or device failure.

Fluidic MEMS are utilized in a variety of devices for achieving a variety of functions. Fluidic MEMS incorporating electrostatic actuators may be utilized for micro-pump, micro-mixer, micro-fluidic analysis, and inkjet print head applications.

A sealed actuator cavity in a fluidic MEMS can be susceptible to the pressure variations. One source of pressure variation acting on a MEMS device arises from air pressure changes related to the altitude of particular locations. For example, the altitude above sea level of Rochester, N.Y. is approximately 300.0 feet resulting in a standard local atmospheric pressure of 0.99 atmospheres, while the altitude above sea level of Denver Colo. is approximately 5300.0 feet resulting in a standard local atmospheric pressure of 0.82 atmospheres. Thus when a device embodying a fluidic MEMS is transported from one location, such as a manufacturing location, to another location at a substantially different altitude, such as a user's location, the sealed cavity of the fluidic MEMS is subjected to pressure changes that may result in the fluidic MEMS operating outside of its design parameters.

In many current designs of fluidic MEMS having sealed cavity actuators, a 0.2-0.3 atm reduction in atmospheric pressure requires an additional 4-5 volts of driving voltage to operate the device. Some fluidic MEMS devices that incorporate sealed actuator cavities trap gas as the result of contamination, chemical reaction, or outgassing of structural, residual sacrificial, or packaging materials. For example, some embodiments of fluidic MEMS having sealed actuator cavities are fabricated with a process that requires an actuator to be sealed by organic materials such as SU8 polymer. The internal pressure of the device in the vicinity of the sealing materials may be altered by the out-gassing of the sealing materials. In one particular application, ambient pressure changes or internal pressure changes may cause an inkjet print head that incorporates a fluidic MEMS having a sealed actuator cavity to experience degradation in the jetting speed, drop volume, directionality, or overall print quality produced by the print head. For all these reasons, reduced sensitivity of actuators in fluidic MEMS devices to pressure fluctuations is desirable.

Some prior attempts have been made to reduce the sensitivity of actuators in fluidic MEMS devices to pressure variation. One attempt to address the pressure differential problems provides a micro-fluidic structure that is vented to atmosphere to allow pressure equalization to occur outside a normal operating cycle of the actuator chamber between the seal and the actuator electrode. This approach to addressing pressure differential problems may cause stiction concerns because humidity in the air may result in condensation that leads to capillary forces that cause stiction.

A fluidic MEMS device is disclosed herein that exhibits a reduced sensitivity to pressure variations arising from one or more of the sources noted above. One such fluidic microelectromechanical device includes a pressure compensating subsystem that enables the device to operate consistently in changing pressure conditions. The device includes an actuator having an actuator cavity underneath an actuator membrane, the actuator membrane moving in response to a driving signal applied to an actuator electrode, and a pressure compensating chamber that is coupled to the actuator cavity.

In one embodiment of a fluidic MEMS device that compensates for changing pressure conditions, the pressure compensating chamber is covered with a flexible covering that is more responsive to pressure fluctuations than the actuator membrane. The flexing of the covering enables the fluid in the pressure compensating chamber to absorb the pressure differential before the actuator membrane responds. Thus, the effect of the changing pressure on the actuator cavity is negligible. The covering over the pressure compensating chamber may be rendered more flexible than the actuator membrane by constructing the flexible covering with a width and length relative to the width and length of the actuator membrane in a manner described in more detail below.

In another embodiment of such a fluidic device, the pressure compensating chamber is covered with a plate that is coupled to the rigid walls to form the pressure compensating chamber. The pressure compensating chamber formed by the rigid walls and plate is much larger than the actuator cavity to which the pressure compensating chamber is coupled. For example, the pressure compensating chamber may be 1 to 2 orders of magnitude taller than the actuator cavity. The coupling of the larger pressure compensating chamber to the actuator cavity enables the gas in the actuator cavity to resist deformation by pressure fluctuations in the device. This embodiment, however, is not responsive to ambient pressure changes because the plate and rigid walls do not respond to ambient pressure changes as the flexible covering does in the embodiment described earlier.

A print head for an inkjet printer may be constructed with such a fluidic electro-mechanical construction. Such a print head may comprise a substrate, a plurality of actuators formed over the substrate, the actuators being actuated by electrical signals, a plurality of actuator membranes and actuator cavities, each actuator membrane and actuator cavity in the plurality being formed over the substrate, each actuator membrane moving in response to excitation of the actuator about which the actuator membrane is mounted, a fluidic chamber having an inlet for drawing ink from an ink supply into the fluidic chamber in response to the actuator being excited, a nozzle in each fluidic chamber through which ink is expelled from the fluidic chamber in response to the actuator membrane returning to its position before excitation, a pressure compensating chamber being formed over the substrate, the pressure compensating chamber being in fluid communication with each actuator cavity in the plurality of actuator cavities, and a covering over the pressure compensating chamber to separate the pressure compensating chamber from ambient air.

Additional features and advantages of the presently disclosed fluidic MEMS device will become apparent to those skilled in the art upon consideration of the following detailed description of embodiments embodying the pressure compensating subsystem discussed above.

BRIEF DESCRIPTION OF THE DRAWINGS

A more complete understanding of the disclosed apparatus can be obtained by reference to the accompanying drawings wherein.

Corresponding reference characters indicate corresponding parts throughout the several views. Like reference characters tend to indicate like parts throughout the several views.

DETAILED DESCRIPTION

Figure 1:
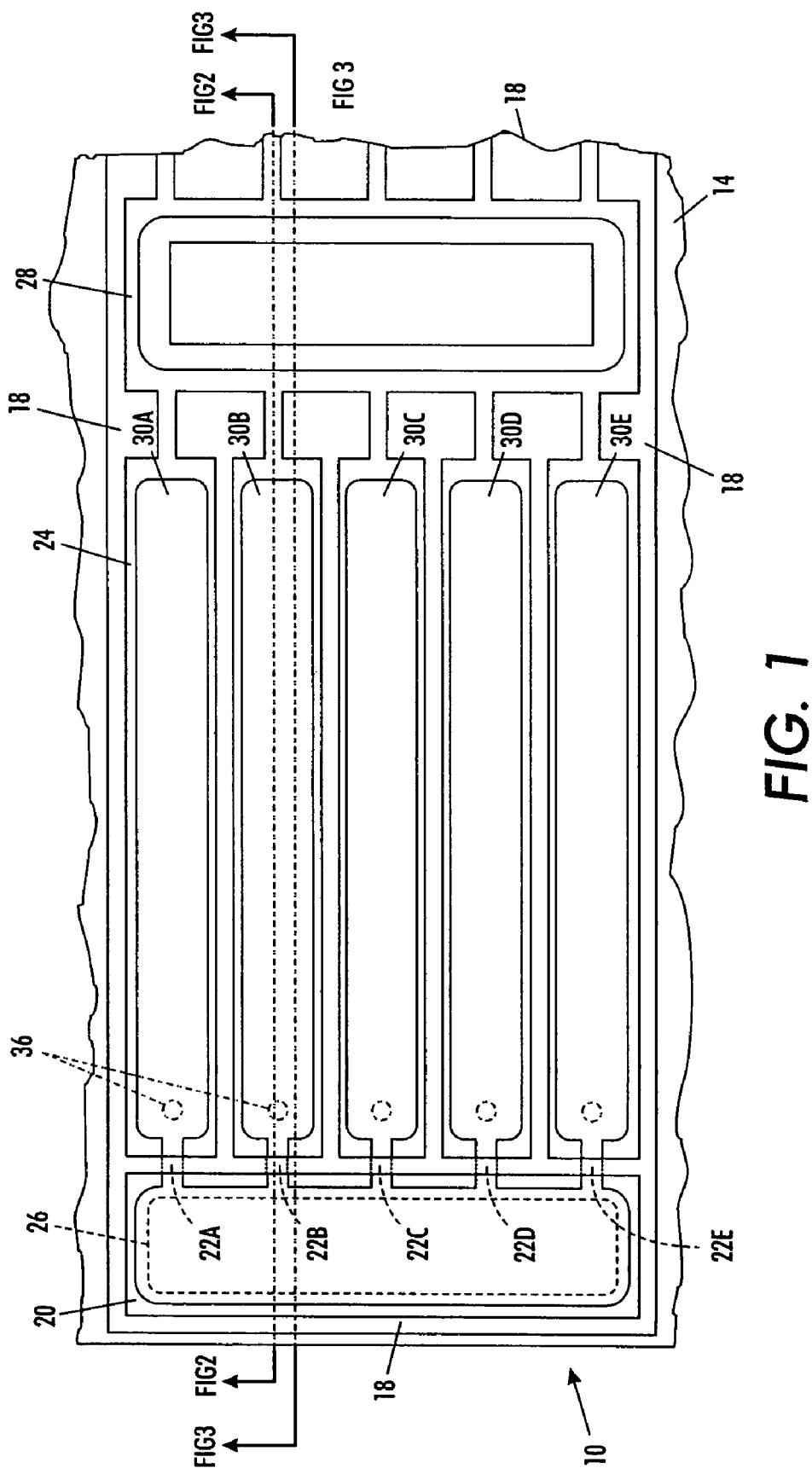
FIG. 1 is a schematic top-view diagram of a fluidic MEMS chip having a pressure compensating subsystem covered with a flexible covering.

For the purposes of promoting an understanding of the principles of the disclosure, reference is now made to the embodiments illustrated in the drawings and described in the following written specification. No limitation to the scope of the disclosure is intended by these particular depictions and their descriptions.

Figure 2:
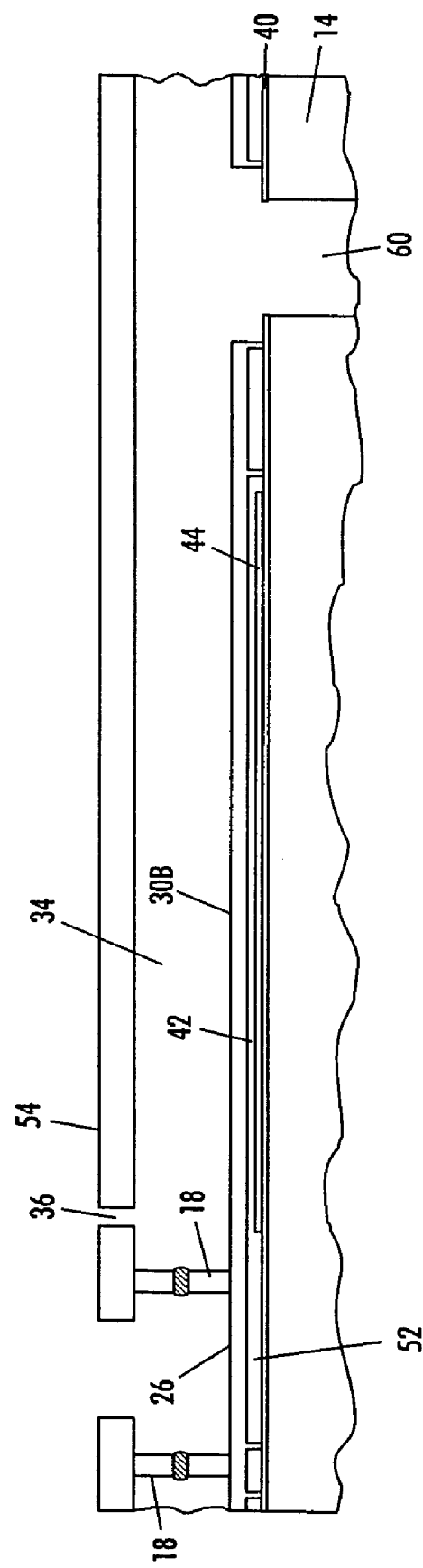
FIG. 2 is a cross-sectional view of the MEMS chip shown in FIG. 1 taken along the cross-sectional lines for FIG. 2 shown in FIG. 1.

A top view of one embodiment of a fluidic MEMS device 10 is shown in FIG. 1. The device 10 includes a substrate 14. There are three main MEMS structure regions on top of substrate 14. There regions are a pressure compensating region 20, an actuator area 24, and an inlet area 28. The substrate may be made from a suitable substrate material for a particular application, such as silicon, and the tall sidewalls 18 that are constructed on top of the silicon substrate may be made of a suitable material, such as nickel. Within actuator area 24 are a plurality of rigid walls that extend across the width of the area to divide the actuator area into a plurality of actuator areas. Actuator membranes 30A-30E are anchored by a known method around the perimeter of the actuator areas to form an actuator cavity 42 between each actuator membrane, 30B, for example, in FIG. 2, and a portion of the underlying substrate 14 (FIG. 2). A covering 26 is anchored around the perimeter of the pressure compensating area 20 to form a pressure compensating chamber 52 (FIGS. 2 and 3) between the covering 26 and a portion of the substrate 14 underlying the covering. The layer separating the pressure compensating area 20 from the actuator area 24 has a plurality of passageways 22A-22E etched in it for an extension from each actuator membrane into the pressure compensating area 20. Therefore, the pressure compensating chamber 52 is in gas or liquid communication with each of the actuator cavities underlying the membranes 30A-30E depending upon whether a gas, such as air, or a liquid is used to implement the actuator. Therefore, gas communication as used herein refers to both gas and liquid flow between the actuator cavities and the pressure compensating chamber depending upon the fluid used to implement the actuator. Although the pressure compensating area is shown as being adjacent to the actuator area in FIG. 1, other arrangements are possible. For example, the pressure compensating area 20 may underlie or be located over the actuator area 24 or the inlet area 28.

The passageways 22A-22E are designed so almost no gas flow occurs between an actuator cavity 42 and the pressure compensating chamber 52 during high frequency operation of the actuator. Air is exchanged between the actuator cavity 42 and the pressure compensating chamber 52 during actuator idle time. To achieve this goal, each passageway 22 is relatively long with a small cross-sectional area. For example, a passageway may have a cross-sectional area of 3-5 μm by 0.5-2 μm and a length of 100-1000 μm. The gas sealed within the actuator cavities 22A-22E and pressure compensating chamber 52 may be air. Alternatively, the gas may be nitrogen ($N_2$), sulfur hexafluoride ($SF_6$), or an inert gas to prevent humidity and contamination effects on the performance of the actuators.

Because the rigid walls 18 extend above the actuator membranes 30A-30E, a fluidic chamber exists over each of the actuator membranes 30A-30E. The rigid wall 18 separating the actuator area 24 from the inlet area 28 is segmented so that a plurality of passageways provide fluid communication between the inlet area 28 and the fluidic chambers 34 overlying the actuator membranes 30E-30E. Consequently, expansion of a fluidic chamber caused by the movement of an actuator membrane towards the substrate 14 results in the flow of fluid from the inlet area 28 into the fluidic chamber in which the actuator membrane moved. Return of the actuator membrane to its equilibrium position expels some of the fluid in the fluidic chamber out through a nozzle 36 associated with the fluidic chamber and some of the fluid flows back to the inlet region 28.

In further detail, FIG. 2 shows a cross-section of the device 10 through the passageway 22B. Deposited on the substrate 14 may be one or more insulating layers 40. The insulating layer may be comprised of silicon dioxide and silicon nitride. A conductive layer, which may be comprised of polysilicon, may be deposited and etched to form a bottom electrode 44 for an actuator. Although the example of a device incorporating a pressure compensating subsystem is described with reference to an electrostatic actuator, devices incorporating a piezoelectric actuator or any actuator having a cavity underneath an actuator membrane may also utilize such a subsystem. A sacrificial layer, which may be comprised of silicon dioxide, may be deposited, patterned, and etched to form holes for anchoring a subsequent structural layer. The structural layer forms the flexible pressure compensating membrane 26 and the actuator membranes 30A-30E. These structural layers may be comprised of polysilicon. The flexible membrane 26 anchored over the pressure compensating area 20 and the underlying substrate form a pressure compensating chamber 52 for pressure compensation in the device 10. The actuator membranes 30A-30E anchored over the actuator areas and the underlying substrate form a plurality of actuator cavities 42. The structural layer comprising the flexible membrane 26 is optionally etched to decrease the thickness of the layer and its corresponding stiffness so it is more responsive to pressure fluctuations than the actuator membranes 30A-30E. The thickness of the actuator membranes 30A-30E may be approximately 1.5 times to approximately 3 times the thickness of the flexible membrane 26.

A seed layer (not shown), which may be comprised of gold or copper, may be deposited, patterned, and etched for electroless plating. A thick layer is then deposited and patterned to form a mold for a subsequent plating step. If the thick layer is a photoresist layer, then no etching is required. After the mold is formed, a metal wall made of nickel, for example, is electrolessly plated to form the rigid walls 18. The mold is then removed. In some embodiments, the MEMS device 10 is formed on two wafers, an upper wafer and a lower wafer. In other embodiments, the walls may be formed at the desired height and then a cover is placed over the device. When the two wafer construction is used, the upper wafer has a seed layer of gold or copper, for example, deposited on it and then a thick layer to form a mold is deposited and patterned. The other halves of the rigid walls are formed with an electrolessly plated metal. A solder layer is electroplated on the ends of the walls and the mold material is removed.

The two wafers are bonded together by holding them face-to-face and heating them so the solder forms a bond between adjoining metal walls. The top wafer 54 may be ground down to its desired height and deep reactive ion etching may be used to form nozzle holes 36 for the fluidic chambers in the top wafer 54. The deep reactive ion etching may optionally be used to expose the flexible membrane 26 over the pressure compensating area to ambient air. The bottom wafer is also etched using the deep reactive ion etching to form an inlet 60 to the inlet area.

As shown in FIG. 2, the inlet 60 provides access to the inlet area 28 for a fluid source. The fluid entering through the inlet flows into one of the fluidic chambers 34 overlying an actuator membrane 30B. An electrical signal in one of the actuator electrodes 44 causes the actuator membrane 30A-30E that overlies the actuator electrode coupled to an active signal to move towards the actuator electrode, although other types of excitation may be used to actuate other types of actuators. This deflection expands the fluidic chamber and decreases the pressure in the chamber 34 so fluid flows from the inlet area 28 into the fluidic chamber. When the signal in the actuator electrode 44 returns to an inactive state, the actuator membrane returns to its equilibrium position. This action causes a portion of the fluid in the fluidic chamber 34 to be expelled from the fluidic chamber through the nozzle 36. When the MEMS device 10 is coupled to an ink source, it may be operated as an ink jet print head.

Figure 3:
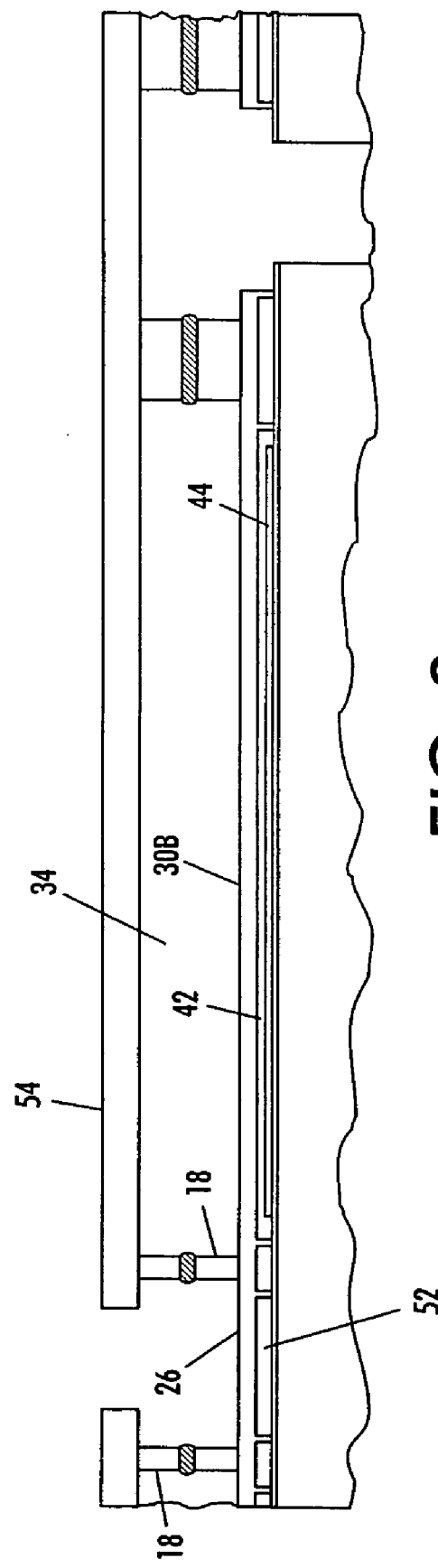
FIG. 3 is a cross-sectional view of the MEMS chip shown in FIG. 1 taken along the cross-sectional lines for FIG. 3 shown in FIG. 1.

FIG. 3 is a cross-sectional view of the MEMS device 10 through the layer adjacent the passageway 22B. Thus, FIGS. 2 and 3 demonstrate that a layer of material separates the pressure compensating chamber 52 from the actuator cavities 42 except for the passageways 22A-22E. This separating layer is typically comprised of silicon as described earlier.

The pressure compensating area under the flexible membrane 26 aids in immunizing the actuator membranes 30A-30E from the effects of pressure fluctuations through at least two mechanisms. For one, as noted above, the flexible membrane 26 may be etched so it is thinner and, therefore, more responsive to pressure fluctuations. Thus, the flexible membrane 26 is likely to deflect in response to a pressure change and relieve the pressure differential before it affects any of the actuator membranes 30A-30E. Secondly, the dimensions of the flexible membrane 26 are sized to provide a substantially larger volume under the flexible membrane than the sum of the volumes of the actuator cavities 42. Even without etching, the larger area of the flexible membrane 26 would render the membrane 26 more flexible than any one of the actuator membranes 30A-30E because they are smaller in surface area that the flexible membrane 26.

As shown in the figures, the actuator membranes 30A-30E and the flexible membrane 26 are generally rectangular in shape. The flexibility of the actuator membranes and the flexible membrane may be described with the following equations:

$$D = \frac{Et^3}{12(1-v^2)}$$

$$\Delta P = \frac{Dy}{0.0026w^4}$$

Where y is the deflection of a membrane caused by a pressure differential $\Delta P$, w is the short dimension or width of a rectangular membrane, D is the flexural rigidity of a membrane, E is Young's modulus, t is the thickness of the membrane, and v is Poisson's ratio. As the formulae show, when the width of the pressure compensating membrane 26 is five times the width of an actuator membrane, the flexible membrane is 3125 times more flexible than the actuator membrane. For acceptable pressure compensating characteristics, the short dimension of the flexible membrane 26 may be approximately 3 to approximately 10 times the width of the actuator membrane. These dimensions help ensure that environmental pressure changes are more likely to be absorbed by the flexible membrane rather than by one of the actuator membranes.

The actual amount of deflection in the flexible pressure compensating membrane 26 may be calculated from the following equation:

$$P_1(V_{a1}+V_{b1})=P_2(V_{a2}+V_{b2})$$

Where $P_1$ is the initial pressure inside the membrane cavity, $V_{a1}$ is the sum of the initial volumes of the actuator cavities covered by the actuator membranes 30A-30E, $V_{b1}$ is the initial volume of the pressure compensating chamber covered by the flexible covering 26, $P_2$ is the final pressure, $V_{a2}$ is the sum of the final volumes of the actuator cavities, $V_{b2}$ is the final volume of the pressure compensating chamber 52. Since the flexible membrane 26 is designed to be much more flexible than the actuator membranes 30A-30E, either no or minimum deflection of the actuator membranes 30A-30E should occur, i.e., $V_{a1}=V_{a2}$. Also, $V_{b2}=V_{b1}+\Delta V_b$, where $\Delta V_b$ is the volume change of the pressure compensating chamber 52. Therefore:

$$P_1(V_{a1}+V_{b1})=P_2(V_{a1}+V_{b1}+\Delta V_b)$$

For illustration purposes, assume a print head incorporating a fluidic MEMS 10 having a sealed actuator cavity is manufactured in Rochester and shipped to Denver for use. As mentioned above, the altitudes and consequently standard pressures in Rochester and Denver are substantially different. The volumetric changes can be calculated for the pressure change due to altitude change between Rochester and Denver. In this case P1=1 atm, P2=0.82 atm.

$$\Delta V_b = \frac{0.18}{0.82}(V_{a1}+V_{b1})$$

Further assume the length, $L_b$, of the flexible membrane is equal to the total width of the actuator area 24. Substituting the values for the actuator membrane length of 1000 μm, the membrane gap of 0.8 μm, and the flexible membrane width of 500 μm, the equation now reads:

$$y * L_b * 500 = \frac{0.18}{0.82}(5L_b * 0.8 * 1000 + 500 * L_b * 0.8)$$

The flexible membrane 26 bulges no more than 0.5 μm in this case.

An illustration of how the pressure compensating chamber 52 absorbs pressure variation caused by out gassing is now presented. If an additional pressure of 0.1 atm is accumulated inside the actuator cavities during the manufacturing process of plugging release or venting holes with SU8 polymer, the deflection of the pressure compensating membrane 26 can still be calculated. Deriving from the above discussed formulae:

$$\Delta V_b = -0.1(V_{a1} + V_{b1})$$

In this case, the pressure compensating membrane 26 is deflected downwardly by 0.24 μm.

While the flexible membrane 26 discussed above is made from the same polysilicon membrane material as the actuator membranes 30A-30E, the flexible membrane 26 may also be made from SU8 polymer or other silicon layers. Furthermore, the flexible membrane may be dimpled by known methods to reduce the possibility of stiction.

The surface micro-machined actuator and flexible membranes need to be released. In one embodiment of a MEMS device, the release holes are formed in the top of the device and the release holes are made relatively narrow and long (typically 2-3 μm by 15 μm). These release holes are more feasibly plugged by depositing oxide in the holes as is known.

While some embodiments are described with reference to an ink-jet printer, one ordinarily skilled in the art would understand that embodiments herein are not limited to ink jet printers. Rather, any MEMS device that uses sealed actuator cavities is contemplated by this disclosure, including, but not limited to a micro pump, or other fluid device. The example shown in the drawings has an active polysilicon membrane 30, such as one of the membranes 30A-30E, over an electrode 44. This lower electrode (actuator) 44 can have a charge applied to it to attract the membrane 30 towards it. When the charge is released, the membrane 30 springs back to its natural position. When a fluidic cavity 34 is formed over the membrane 30, the forces generated during the release of membrane 30 eject a droplet of ink through the nozzle opening 36 onto a piece of media. By varying the design of this type of structure, a wide variety of small pumps, chambers, and sensors may be constructed.

If the pressure in an actuator cavity between an electrode 44 and a membrane is altered significantly, operation of the device could be affected. Too much or too little pressure can alter the deflection characteristics of the membranes 30A-30E in an undesirable manner. The flexible membrane 26 and its underlying pressure compensating chamber 52 help maintain the pressure beneath the membranes 30A-30E to make the operation of the device more reliable.

Figure 4:
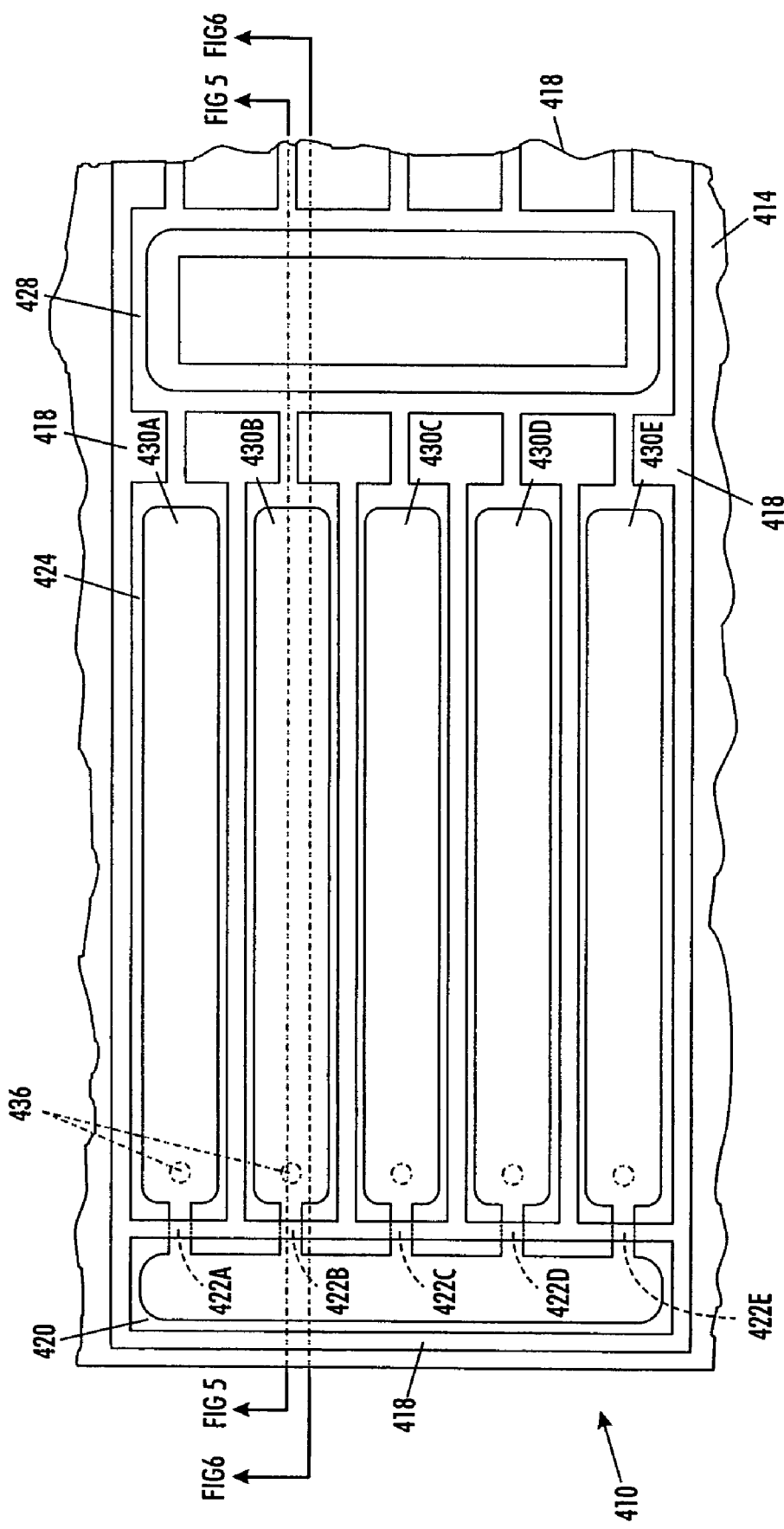
FIG. 4 is a schematic top view diagram of a fluidic MEMS chip having a pressure compensating chamber formed with rigid walls and a plate.
Figure 5:
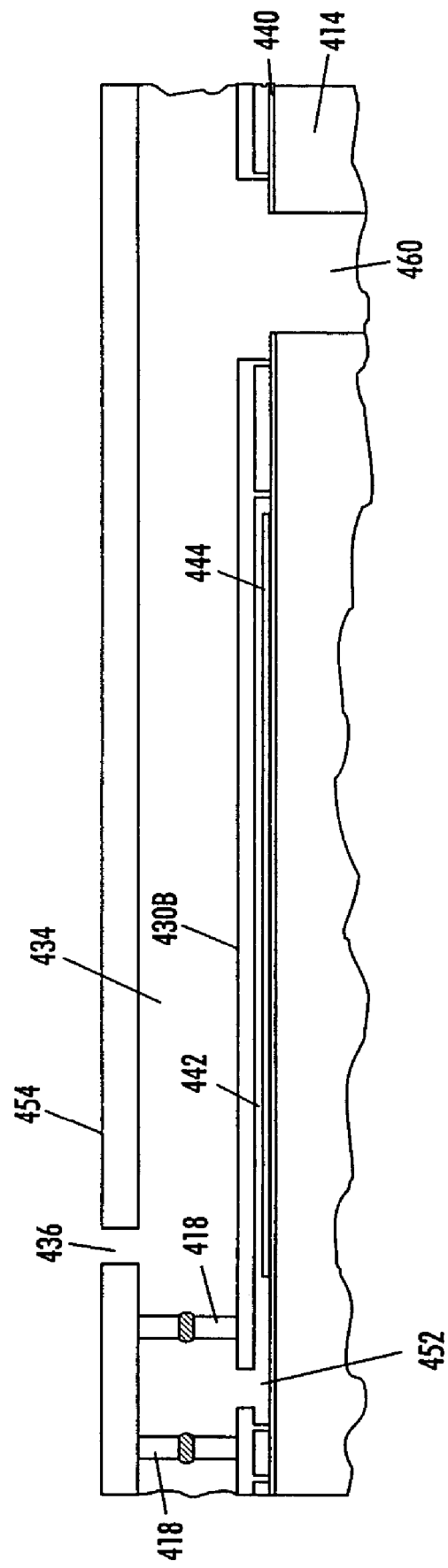
FIG. 5 is a cross-sectional view of the MEMS chip shown in FIG. 4 taken along the cross-sectional lines for FIG. 5 shown in FIG. 4.
Figure 6:
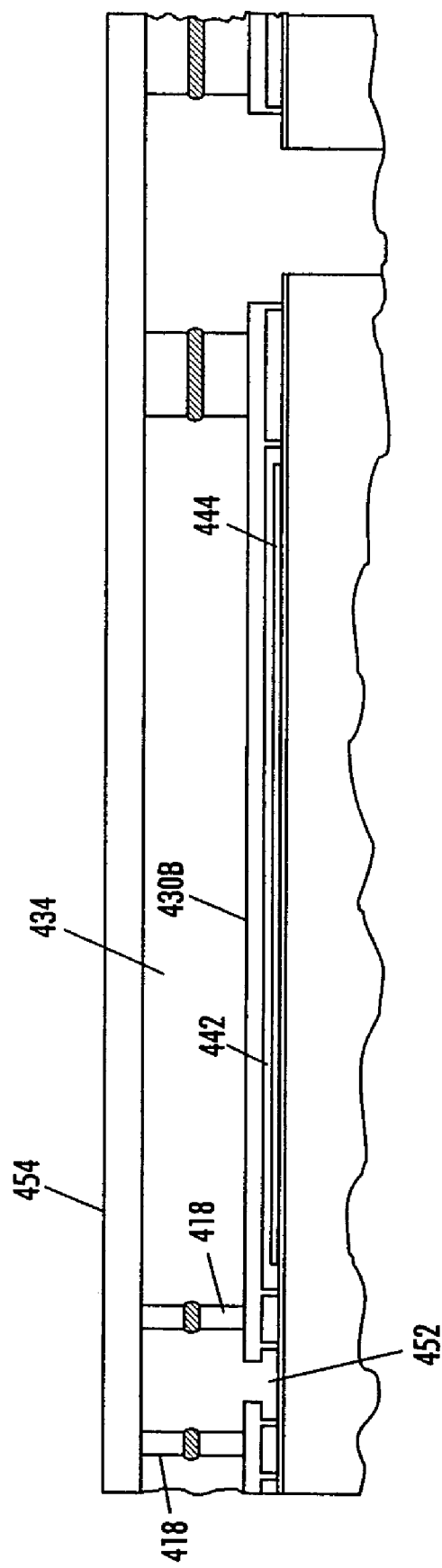
FIG. 6 is a cross-sectional view of the MEMS chip shown in FIG. 4 taken along the cross-sectional lines for FIG. 6 shown in FIG. 4.

A second embodiment of an improved fluidic MEMS device 410 is shown in FIGS. 4-6. The device 410 includes a substrate 414 from which tall side walls 418 extend upwardly to divide the substrate into three main regions. These regions are a pressure compensating region 420, an actuator area 424, and an inlet area 428. The substrate may be made from a suitable substrate material for a particular application, such as silicon, and the rigid walls 418 may be made of suitable material, such as nickel. Within actuator area 424 are a plurality of rigid walls that extend across the width of the area to divide the actuator area into a plurality of actuator areas. Actuator membranes 430A-430E are anchored by a known method around the perimeter of the actuator areas to form an actuator cavity 442 between each of the actuator membranes 430A-430E and a portion of the underlying substrate 414. The layer separating the pressure compensating area 424 from the actuator area 428 is etched to provide a plurality of passageways 422A-422E for providing gas flow between the actuator cavities 442 and the pressure compensating area 424. Although the pressure compensating area is shown as being adjacent to the actuator area in FIG. 4, other arrangements are possible. For example, the pressure compensating area 420 may underlie or be located over the actuator area 424 or the inlet area 428.

The passageways 422A-422E are designed so almost no gas flow occurs between an actuator cavity 442 and the pressure compensating chamber 452 during high frequency operation of the actuator. Air is exchanged between the actuator cavity 442 and the pressure compensating chamber 452 during actuator idle time. To achieve this goal, each passageway 422 is relatively long with a small cross-sectional area. For example, a passageway may have a cross-sectional area of 3-5 μm by 0.5-2 μm and a length of 100-1000 μm. The gas sealed within the actuator cavities 422A-422E and pressure compensating chamber 452 may be air. Alternatively, the gas may be nitrogen ($N_2$), sulfur hexafluoride ($SF_6$), or an inert gas to prevent humidity and contamination effects on the performance of the actuators.

Because the side walls 418 extend above the actuator membranes 430A-430E, a fluidic chamber exists over each of the actuator membranes 430A-430E. The side wall 418 separating the actuator area 424 from the inlet area 428 is segmented so that a plurality of passageways provide fluid communication between the inlet area 428 and the fluidic chambers 434 overlying the actuator membranes 430A-430E. Consequently, expansion of a fluidic chamber caused by the movement of an actuator membrane towards the substrate 414 results in the flow of fluid from the inlet area 428 into the fluidic chamber in which the actuator membrane moved. Return of the actuator membrane to its position before the downward displacement expels some of the fluid in the fluidic chamber out through a nozzle 436 and some of the fluid returns to the inlet region 428.

In further detail, FIG. 5 shows a cross-section of the device 410 taken through passageway 422B in FIG. 4. Deposited on the substrate 414 may be one or more insulating layers 440. The insulating layer may be comprised of silicon dioxide and silicon nitride. A conductive layer, which may be comprised of polysilicon, may be deposited and etched to form a bottom electrode 444 for an actuator. A sacrificial layer, which may be comprised of silicon dioxide, may be deposited, patterned, and etched to form holes for anchoring a subsequent structural layer. The structural layer forms the actuator membranes 430A-430E that extend past the rigid wall into the pressure compensating area 420. At least a portion of the membranes 430A-430E are not anchored to the substrate 414 within the pressure compensating area 420 so gas communication is provided between the actuator cavities 442 and a pressure compensating chamber 452. The structural layer forming the actuator membranes may be comprised of polysilicon. The actuator membranes 430A-430E anchored over the actuator areas and the underlying substrate form a plurality of actuator cavities 442.

A seed layer (not shown), which may be comprised of copper or gold, may be deposited, patterned, and etched for electroless plating. A thick layer is then deposited and patterned to form a mold for a subsequent plating step. If the thick layer is a photoresist layer, then no etching is required. After the mold is formed, a metal wall made of nickel, for example, is electrolessly plated to form the rigid walls 418. The mold is then removed. In some embodiments, the MEMS device 410 is formed on two wafers, an upper wafer and a lower wafer. In other embodiments, the walls may be formed at the desired height and then a cover is placed over the device. When the two wafer construction is used, the upper wafer has a seed layer of copper or gold, for example, deposited on it and then a thick layer to form a mold is deposited and patterned. The other halves of the rigid walls are formed with an electrolessly plated metal. A solder layer is electroplated on the ends of the walls and the mold material is removed.

The two wafers are bonded together by holding them face-to-face and heating them so the solder forms a bond between adjoining metal walls. The top wafer 454 may be ground down to its desired height and deep reactive ion etching may be used to form nozzle holes 436 for the fluidic chambers in the top wafer 454. The bottom wafer is also etched using the deep reactive ion etching to form an inlet to the inlet area. Once the wafers have been bonded to one another, the pressure compensating chamber 452 is closed to ambient air. The major difference between this embodiment and the one described above with reference to FIGS. 1-3 is that the pressure compensating chamber 452 in the second embodiment includes the tall chamber area between the nickel walls. In the earlier described embodiment, the chamber 52 is a relatively shallow cavity.

As shown in FIG. 5, the inlet 460 provides access to the inlet area 428 for a fluid source. The fluid entering through the inlet flows into one of the fluidic chambers 434 overlying an actuator membrane 430B. An electrical signal in one of the actuator electrodes 444 causes the actuator membrane 430A-430E that overlies the actuator electrode coupled to an active signal to move towards the actuator electrode. This deflection expands the fluidic chamber and decreases the pressure in the chamber 434 so fluid flows from the inlet area 428 into the fluidic chamber. When the signal in the actuator electrode 444 returns to an inactive state, the actuator membrane returns to its equilibrium position. This action causes a portion of the fluid in the fluidic chamber 434 to be expelled from the fluidic chamber through the nozzle 436. When the MEMS device 410 is coupled to an ink source, it may be operated as an ink jet print head.

FIG. 6 is a cross-sectional view of the MEMS device 410 that is taken through the layer adjacent passageway 422B. Thus, FIGS. 5 and 6 demonstrate that a layer of material separates the actuator cavities 442 from the pressure compensating chamber 452 except for the passageways 422A-422E in the layer. This separating layer is typically comprised of silicon as described earlier.

The pressure compensating chamber 452 aids in immunizing the actuator membrane 430 from the effects of pressure fluctuations because the dimensions of the chamber 452 are sized to provide a substantially larger volume than the sum of the volumes of the actuator cavities 442. This additional volume that is in gas communication with the actuator cavities 442 provides the actuator membranes 430A-430E with resiliency to absorb pressure changes that may arise from internal pressure fluctuations.

The pressure compensating chamber 452 creates a large pocket of air in the system that decreases the effect of pressure generated inside the system (due to outgassing, chemical reaction, arcing, etc.) because more volume means less pressure variation for a given amount of additional gas generated (PV=nRT). Because the pressure is acting on a larger volume, a smaller differential pressure is experienced by the actuator membranes 430A-430E and there is less deflection of the membranes resulting from the fluctuation. Optionally, a rigid cover 454 means the pressure compensating chamber 452 does not absorb changing ambient (external) pressure, because the top wafer does not provide a pressure responsive interface as the flexible membrane 26 does in the MEMS device 10 discussed above. The air volume in the pressure compensating chamber 452 is illustratively much higher (approximately 50 times to approximately 100 times) than the total air volume under all the membranes 430A-430E as the pressure compensating chamber 452 is about 80 μm in height, whereas the air under each of the membranes 430A-430E is less than 1 μm in height.

While the foregoing has been described in conjunction with various exemplary embodiments, it is to be understood that many alternatives, modifications, and variations would be apparent to those skilled in the art. Accordingly, Applicants intend to embrace all such alternatives, modifications and variations that follow in this spirit and scope.

What is claimed is:

1. A fluidic micro-electromechanical device comprising:
   an actuator having an actuator cavity underneath an actuator membrane, the actuator membrane moving in response to a driving signal applied to an actuator electrode;
   a pressure compensating chamber; and
   a passageway coupling the pressure compensating chamber to the actuator cavity, the passageway being configured to impede flow between the actuator cavity and the pressure compensating chamber during high frequency operation of the actuator and to enable flow between the actuator cavity and the pressure compensating chamber when the actuator is idle, the passageway being configured to have a length in a range of 100 μm to 1000 μm and a cross-sectional area in a range of 1.5 μm$^2$ to 10 μm$^2$.

2. The device of claim 1 wherein the actuator membrane is 1.5 times to 3 times as thick as the flexible membrane.

3. The device of claim 1 further comprising:
   a plurality of actuators, each actuator having an actuator cavity beneath an actuator membrane, each actuator membrane moving in response to a driving signal applied to an actuator electrode located in the actuator cavity beneath the actuator membrane; and
   each actuator cavity in the plurality of actuators being coupled to the pressure compensating chamber through a passageway, each passageway being configured to impede flow between the actuator cavity and the pressure compensating chamber during high frequency operation of the actuator and to enable flow between the actuator cavity and the pressure compensating chamber when the actuator is idle.

4. The device of claim 1 wherein the pressure compensating chamber underlies the actuator cavity.

5. The device of claim 3, each passageway is configured to have a length in a range of 100 μm to 1000 μm and a cross-sectional area in a range of 1.5 μm$^2$ to 10 μm$^2$.

6. A fluidic micro-electromechanical system comprising:
   a substrate;
   a plurality of actuator electrodes formed over the substrate;
   a plurality of actuator membranes, each actuator membrane in the plurality being anchored about one of the actuators in the plurality of actuators to form a plurality of independent actuator cavities, each actuator membrane moving in response to an driving signal applied to the actuator electrode about which the actuator membrane is anchored;

a pressure compensating chamber; and a passageway between each actuator cavity and the pressure compensating chamber, each passageway being configured to impede flow between the actuator cavity and the pressure compensating chamber during high frequency operation of the actuator and to enable flow between the actuator cavity and the pressure compensating chamber when the actuator is idle, the passageway being configured to have a length in a range of 100 μm to 1000 μm and a cross-sectional area in a range of 1.5 μm² to 10 μm².

7. A print head for an inkjet printer comprising:

a substrate;

a plurality of actuator electrodes formed over the substrate;

a plurality of actuator membranes, each actuator membrane in the plurality being anchored about one of the actuator electrodes in the plurality of actuator electrodes to form a plurality of independent actuator cavities, each actuator membrane moving in response to a driving signal being applied to the actuator electrode about which the actuator membrane is anchored;

a plurality of fluidic chambers, each fluidic chamber in the plurality of fluidic chambers overlies one actuator membrane in the plurality of actuator membranes;

an inlet for drawing ink from an ink supply into a fluidic chamber overlying an actuator membrane in response to one of the actuator electrodes being excited;

a nozzle in each fluidic chamber through which ink is expelled from the fluidic chamber in response to the actuator membrane, which underlies the fluidic chamber, returning to its position before actuator excitation;

a covering anchored to the substrate to form a pressure compensating chamber; and a passageway between each actuator cavity and the pressure compensating chamber, each passageway being configured to impede flow between the actuator cavity and the pressure compensating chamber during high frequency operation of the actuator and to enable flow between the actuator cavity and the pressure compensating chamber when the actuator is idle, the passageway being configured to have a length in a range of 100 μm to 1000 μm and a cross-sectional area in a range of 1.5 μm² to 10 μm².

8. The device of claim 7 wherein each actuator membrane is 1.5 times to 3 times as thick as the flexible covering.

9. The device of claim 7, wherein the actuator cavities and the pressure compensating chamber are sealed with air therein.

10. The device of claim 7, wherein the actuator cavities and the pressure compensating chamber are sealed with nitrogen, sulfur hexafluoride, or an inert gas therein.

11. The device of claim 7 wherein the pressure compensating chamber underlies the actuator cavity.

12. The device of claim 7 wherein the pressure compensating chamber underlies the inlet.

13. The device of claim 7 wherein the pressure compensating chamber is located over the inlet.

* * * * *